US006663340B1

(12) United States Patent
Zeakes et al.

(10) Patent No.: US 6,663,340 B1
(45) Date of Patent: Dec. 16, 2003

(54) WAFER CARRIER TRANSPORT SYSTEM FOR TOOL BAYS

(75) Inventors: Jason S. Zeakes, Round Rock, TX (US); Clinton Haris, Lunenburg, MA (US); Karl E. Mautz, Round Rock, TX (US); William Mark Hiatt, Eagle, ID (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/232,158

(22) Filed: Aug. 30, 2002

(51) Int. Cl.[7] .............................................. B65G 49/07
(52) U.S. Cl. ....................................... 414/940; 414/935
(58) Field of Search ............................ 414/935, 940; 700/213, 214, 218, 228

(56) References Cited

U.S. PATENT DOCUMENTS

| | | | | |
|---|---|---|---|---|
| 4,795,299 A | * | 1/1989 | Boys et al. .................. | 414/217 |
| 5,664,926 A | * | 9/1997 | Sussman et al. ........ | 414/222.13 |
| 6,573,198 B2 | * | 6/2003 | Boonstra et al. ............ | 438/795 |
| 6,582,174 B1 | * | 6/2003 | Hayashi ...................... | 414/217 |
| 6,582,182 B2 | * | 6/2003 | Whalen ....................... | 414/276 |

* cited by examiner

Primary Examiner—Khoi H. Tran
(74) Attorney, Agent, or Firm—Kim-Marie Vo

(57) ABSTRACT

A processing tool bay within a semiconductor fabrication site, including a plurality of semiconductor processing tools for processing wafers being arranged in two opposite rows. An intrabay transport system for transporting wafer carriers around the process tool bay at least in a vertical plane in front of one of said two rows of semiconductor process tools comprises at least one vehicle for receiving and delivering a wafer carrier to and from any one semiconductor process tool of said plurality of semiconductor process tools, and a vehicle guiding mechanism. The vehicle comprises a circular compartment structure including a plurality of compartments for buffering said wafer carrier between receiving it at a first location and delivering it at a second location. Each compartment is arranged for accommodating one wafer carrier. The compartment structure is rotatable around a symmetry axis of itself for an alignment. The distance between the two opposite rows of processing tools is determined so as to enable a displacement of at least one vehicle.

22 Claims, 6 Drawing Sheets

WAFER CARRIER TRANSPORT SYSTEM FOR TOOL BAYS

FIELD OF THE INVENTION

The present invention generally relates to the transport and storage of semiconductor wafers within a tool bay including various tools in a semiconductor wafer fabrication site, and in particular to a buffer, delivery and stocker system for wafer carriers.

BACKGROUND OF THE INVENTION

Typically, in a semiconductor wafer fab each wafer is processed in several different tools for performing various wafer fabrication functions. The tools are arranged in so-called tool bays each comprising in general on the order of 15 to 20 process tools. Each tool bay is typically on the order of about eighty feet long. In order to enhance the throughput of wafers in the fab and/or to fabricate different wafers with different structures, there are usually multiple tool bays provided in the wafer fab.

The wafers are kept and transported as batches between the tools in carriers each being capable of accommodating about 25 wafers. Such carriers are mini-environments and are tightly sealed and are only opened to be loaded or unloaded. Thus it is ensured that particle fluxes onto semiconductor wafers in the carriers are reduced during storage and transport of the wafers through the semiconductor fabrication process. The effect of isolating the wafers is enhanced by the fact that the immediate environment (i.e. the surrounding air or gas) of the wafers is essentially stationary in the carriers and particles from outside do not arrive at the wafers.

For transport of the carriers within a wafer fab there is a first automated transport system provided for transferring the carriers between different processing tool bays (interbay delivery systems), and a second automated transport system provided for transferring the carriers around within each particular bay (intrabay delivery systems). Such interbay systems that are used for the transport of two carriers are well known in industry.

Within the tool bays there may be different types of tools, namely some processing tools with high throughput which are capable of performing their particular wafer process at a relatively high rate and other processing tools with a much lower throughput rate, e.g. metrology tools, which in general monitor or test a single wafer from within a pod of wafers. The different requirements as to providing wafer to (feed) the tools are to be matched in a tool bay in order to keep the respective high throughput tool from sitting idle. Hence, it is known to include a local tool buffer adjacent the tool port of high throughput and metrology tools, so that carriers may be stored locally adjacent such tools and quickly transferred to these tools without having to constantly retrieve a carrier from a remotely located stocker. Such stockers may be provided in each tool bay in order to buffer wafer carriers within the tool bay between subsequent processing steps. Each stocker typically has a plurality of shelves.

However, the above conventional transport systems have several disadvantages: firstly, there are numerous movements of the intrabay transport system necessary to retrieve wafer carriers from intrabay stockers or from the intrabay/interbay transport interface and to feed tools in the tool bay. Secondly, since the intrabay transport system has to serve several tools within said tool bay there may occur the situation that two different high throughput tools wait for new wafer carriers to process. In this case the intrabay transport system has to fetch a first wafer carrier from the intrabay/interbay transport interface or from a tool within the tool bay and to deliver it to one of the two waiting tools. Only then the intrabay transport system can retrieve the second wafer carrier for the other of the two waiting tools. So, the second of the two waiting tools stays undesirably idle for a certain time. Thirdly, the complex movements of the intrabay transport system necessitates a performance of the transport algorithm that corresponds directly to the number of loadports and transport vehicles of the intrabay transport system.

The present invention seeks to provide an improved transport system for wafer carriers that overcomes the above disadvantages of prior art systems.

DETAILED DESCRIPTION OF A PREFERRED EMBODIMENT

According to a first aspect of the present invention there is provided a single intrabay vehicle for the transport of multiple wafer carriers. The intrabay transport system according to the invention is characterized in that it comprises a vehicle and a circular compartment structure including a plurality of compartments for buffering wafer carriers between receiving them at a first location and delivering it at a second location.

According to a second aspect of the present invention there is provided a processing tool bay within a semiconductor fabrication site including a plurality of semiconductor processing tools for processing wafers being arranged in two opposite rows. The distance between said two opposite rows is determined so as to enable a displacement of at least one vehicle with a circular compartment structure between said two rows of semiconductor process tools.

According to a third aspect of the present invention there is provided a transport system within a semiconductor fabrication site comprising an intrabay transport system including an overhead hoist vehicle design that enables the transport of more than one carrier to and from a loadport.

Figure 1:
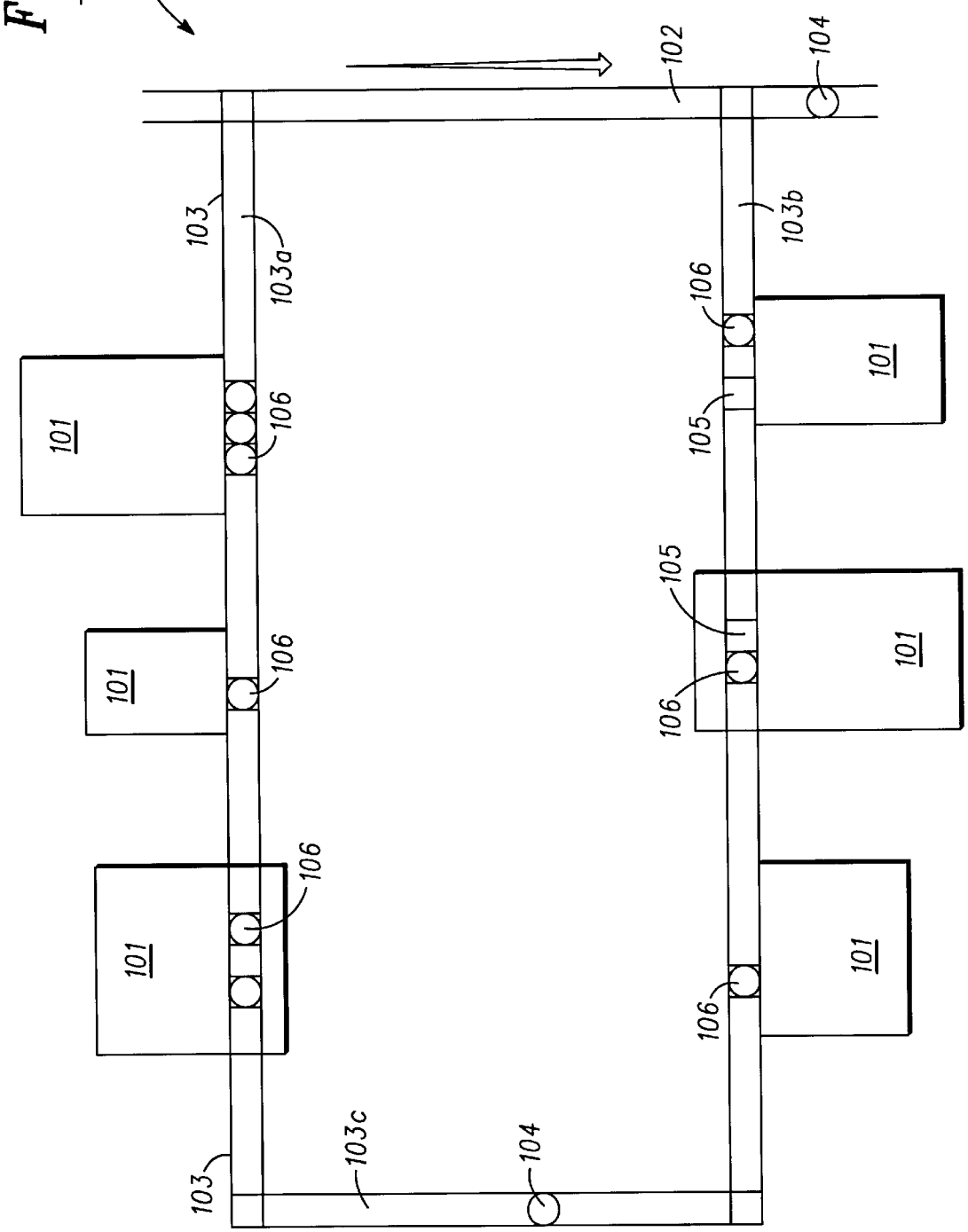
FIG. 1 is a top view of a conventional tool bay.

Referring to FIG. 1, there is a top view of a conventional tool bay having a plurality of semiconductor process tools illustrated. The tool bay is generally indicated by 100. The tool bay 100 comprises various semiconductor process tools, each referenced 101. Wafers to be processed arrive in their carriers at the tool bay 100 via an interbay transport mechanism 102. The interbay transport mechanism 102 may be a one track, one direction conveyor, the direction of which is indicated in FIG. 1 by an arrow. Within the tool bay 100 the wafer carriers are distributed and collected by an intrabay transport mechanism, generally indicated by 103. The conventional intrabay transport mechanism 103 consists of three tracks, namely a first track 103*a* in front of a first row of process tools 101, a second track in front of a second row of process tools 101, and a third track 103*c* that links the first and the second tracks 103*a* and 103*b*. The wafer carriers are picked up by vehicles (not shown) which run on the tracks 103*a*, 103*b*, 103*c*. As an illustration of the path wafer carriers may take on the transport system there are two carriers 104 shown on their way through the conventional intrabay transport system 103 (left in FIG. 1 on track 103*c*) and on their way through the interbay transport system 102 (FIG. 1 bottom right). Typically there is a privileged transport direction in the tool bays such that—due to this directionality—all vehicles cycle either clockwise through the tool bay or counterclockwise, but usually the vehicles are not allowed to travel randomly clockwise or counterclockwise in a bay.

At the corners of the rectangle that is formed by the tracks 103*a*, 103*c*, and 103*b* there are appropriate transfer mechanisms provided (not shown) for the transfer of wafer carriers from one track to another. These mechanisms are well known in the art and will therefore not be described here in detail. (In the alternative the corners of the rectangle may be rounded so that the ensemble of tracks 103*a*, 103*b*, and 103*c* resembles rather an oval than a rectangle.)

The tracks 103*a* and 103*b* are located immediately adjacent to the process tools 101 so as to reach and serve the input/output ports (I/O ports) of the tools 101. In the situation shown in FIG. 1 some of the input/output ports of the tools 101 are occupied by wafer carriers, referenced 106, and some of the input/output ports are currently disengaged, referenced 105. The occupied ports 106 are shown as circles in a square, the disengaged ports 105 are shown as empty squares. The input/output ports may either be positioned at a front panel of their respective process tool 101 or at a covering plate on top of the tool 101. For example, the leftmost tool 101 in the upper row of tools 101 straddling the upper track 103*a* has two I/O ports 106 on the covering plate on top, each being occupied by a wafer carrier. Similarly, the tool 101 shown in the middle of the lower row of tools straddling track 103*b* in FIG. 1 has also two I/O ports on the covering plate, one, 105, being disengaged, the other, 106, being occupied by a wafer carrier. The other tools in FIG. 1 flush with track 103*a* and 103*b*, respectively, have their I/O ports at their respective front panel. The rightmost tool 101 in the upper row has three ports 106, all being occupied by wafer carriers, tool 101 in the middle of the upper row of FIG. 1 has only one port that is currently occupied by a wafer carrier, also the leftmost tool 101 in the lower row has only one port being occupied, and the rightmost tool 101 in the lower row has two ports, spaced apart from each other with one (left) being disengaged, 105, and the other (right) being occupied, 106.

As a consequence the different types of I/O ports within a single tool bay 100 necessitate that if the I/O port is at the front panel of the tool 101, the vehicle must be capable of approaching the tool from the side, i.e. horizontally, in order to deliver and to receive a wafer carrier to and from the tool 101. To the contrary, if the I/O port is on top of the tool at a covering plate of it, the vehicle must be capable of delivering and receiving wafer carriers in a vertical direction. However, although the I/O ports may have different orientations and may be arranged at different locations (levels) in the tool bay, usually all I/O ports are of the same operational type, so that due to their standardization they are all accessible by a single type load/unload mechanism.

Figure 2:
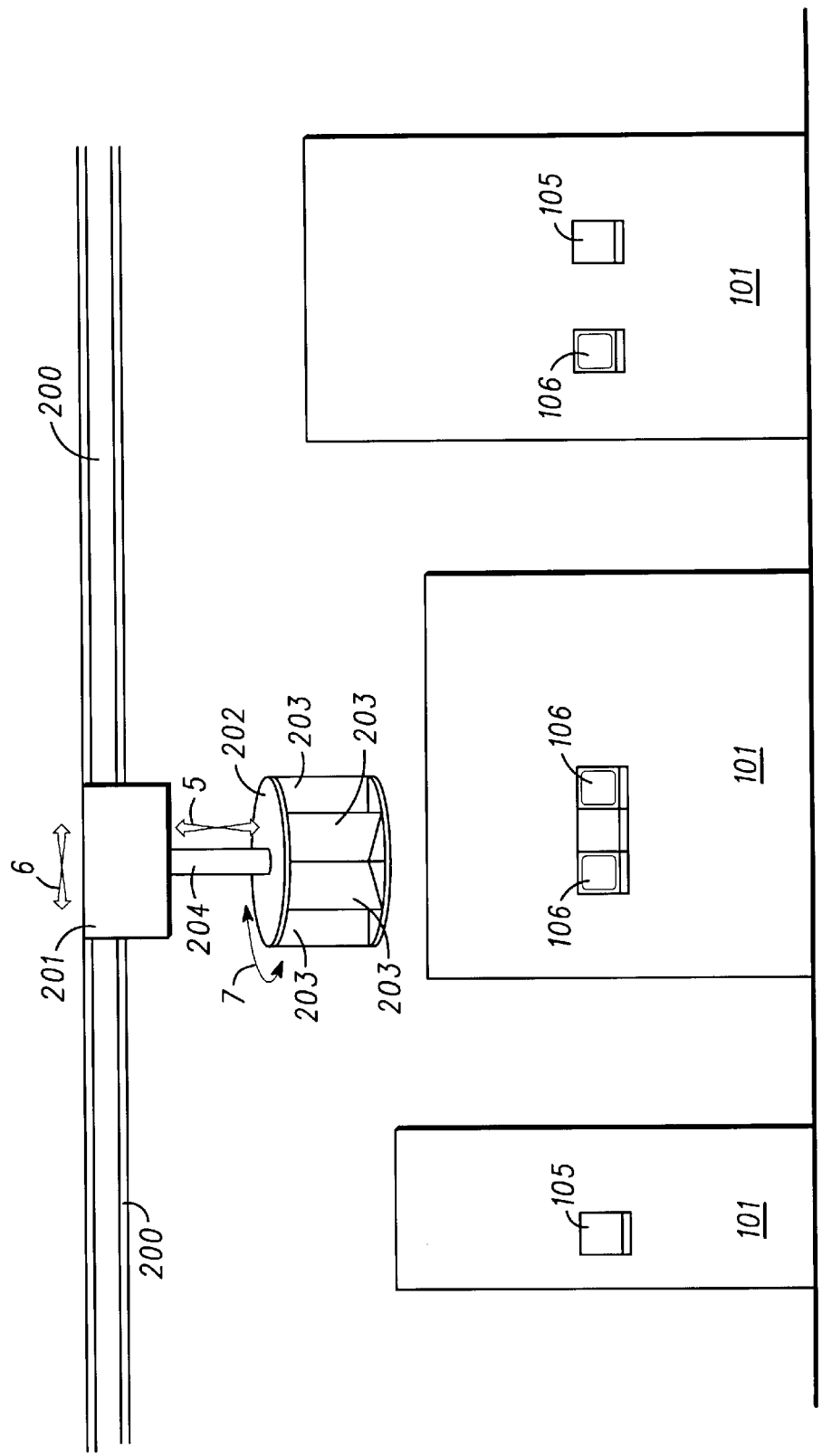
FIG. 2 is a front view of a line of semiconductor process tools within a conventional tool bay.

Referring to FIG. 2 there is shown one row of a tool bay in a front view. For the sake of clearness, in FIG. 2 the I/O ports of the tools 101 are located at the front panels of the tools only, however this is not to be regarded as a limitation of the invention and it is understood that the following definitions are in principle also applicable to I/O ports on the covering plate of the tools. Above the process tools 101 a rail 200 is provided for an overhead hoist vehicle 201 (OHT vehicle). A circular compartment structure 202 suspends from the vehicle 201. The circular compartment structure 202 is illustrated in a semi-perspective view in FIG. 2.

The compartment structure 202 according to the invention comprises several compartments 203 for lodging one wafer carrier each (not shown). The structure 202 is mounted to the vehicle 201 by hoist means 204. The hoist means 204 provide for several degrees of freedom of the compartment structure 202 which are schematically illustrated by arrows in FIG. 2: a bent arrow indicates the angular degree of freedom of the compartment structure 202 and a straight arrow indicates the (vertical) translatory degree of freedom of the compartment structure 202 in a vertical direction. In other words, the compartment structure 202 can be lowered or hoisted by the hoist means 204 so as to level with the I/O ports of the tools 101. Then—as indicated by the curved arrow—the compartment structure 202 is turned clockwise or counterclockwise until an alignment of one of its compartments 203 with one of the ports of the tools 101 is reached. In this configuration a wafer carrier may be moved out of the compartment 203 and locked to the port 105 of the tool 101 or a wafer carrier may be unlocked from the port 106 of the tool 101 and received in the compartment 203 of the aligned compartment structure 202.

In order to prevent parts from falling down from the compartment structure 202 preferably there is provided a guard cover (not shown) under the structure 202. The guard cover may be a simple net spread out under the compartment structure 202 that would catch parts falling to the floor below. A human operator would then retrieve the parts from the net and re-enter them into the process.

Figure 3:
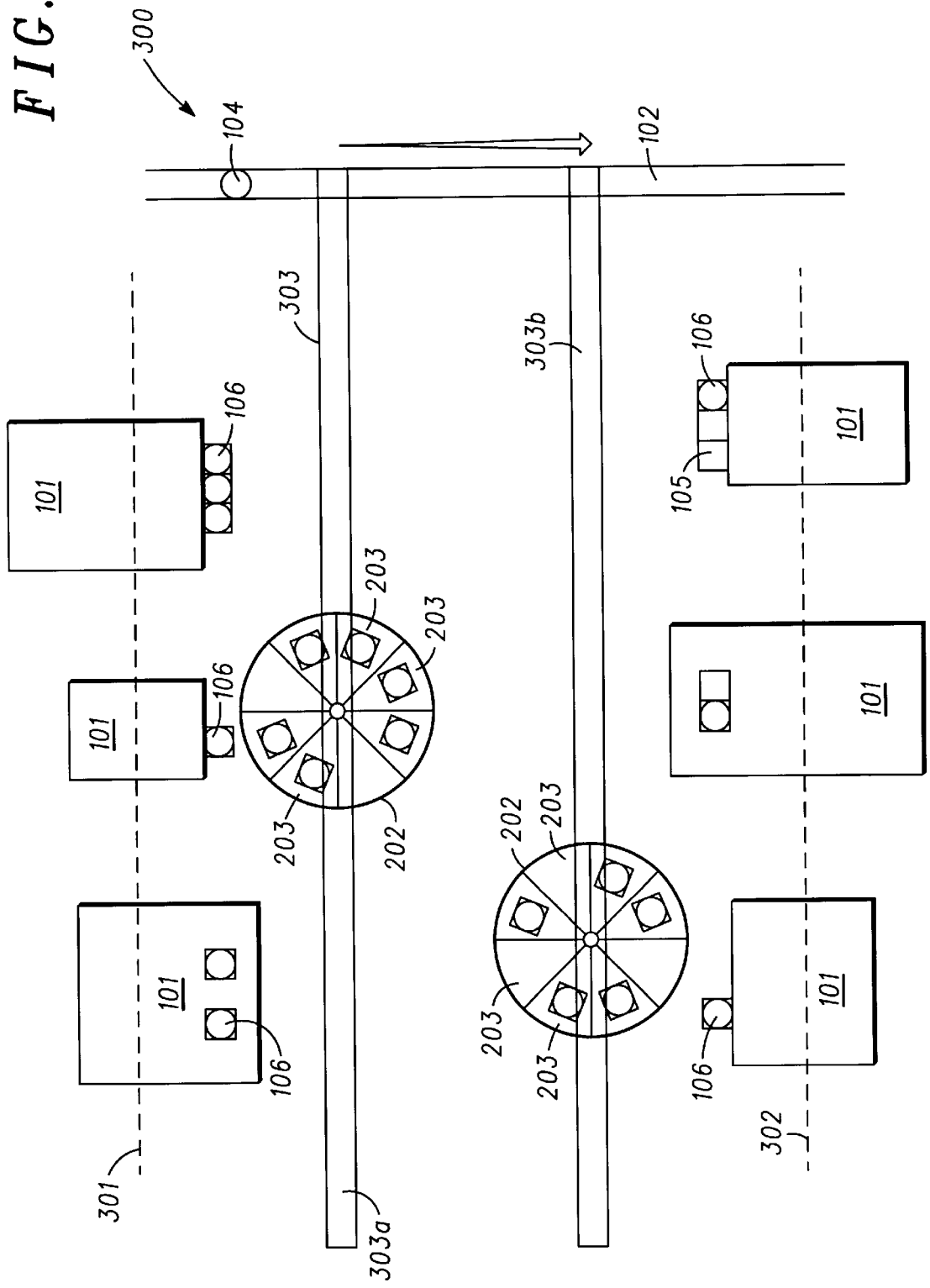
FIG. 3 is a top view of a tool bay according to the present invention.

Referring to FIG. 3, there is shown the top view of a tool bay 300 with an intrabay transport system 303 according to the invention. The process tools 101 of the tool bay 300 are arranged in two rows 301 and 302. The intrabay transport system 303 comprises a track 303*a* in front of rows 301 and 302. Under the track 303*a* there is an OHT vehicle 201 having a compartment structure 202 including a plurality of compartments 203. Some of the compartments 203 are not occupied and may lodge a wafer carrier. For instance there are three wafer carriers attached to the rightmost tool 101 in the upper row 301. It is assumed that one of these wafer carriers has been processed and is now to be picked up and transferred to another tool. The OHT vehicle then approaches the rightmost tool 101 in the upper row 301, and an empty compartment 203 is aligned with the I/O port of the tool 101 by the hoist means 204 in a way that was described above. The wafer carrier is unlocked from the I/O port and a transfer mechanism (not shown) transfers the carrier into the aligned compartment 203. The transfer mechanism will be described below with reference to FIGS. 6A, 6B, and 6C. Thereafter the OHT vehicle moves to another tool in the tool bay 300 or to the interbay/intrabay transport interface at the interbay transport system 102 where it delivers the wafer carrier that it has just received or any other of its wafer carriers. It may take up even another wafer carrier at another location in the tool bay 300 before it delivers one of the already lodged carriers if there is still any compartment 203 available in the compartment structure 202. Similarly, it may discharge all of its wafer carriers at a time before new carriers are loaded and vice versa. With one track between two rows of tools in the tool bay, a tool may even be simultaneously loaded on one side of the bay when another tool is unloaded on the other side of the tool bay.

The different movements of the vehicle 201 and of the hoist mechanism 204 are independent from each other. For instance as the vehicle 201 moves inside the process bay 300 along the track 303a the compartment structure 202 may be lowered and rotated simultaneously into position by the hoist means 204 so that a particular one of the compartments 203 is appropriately aligned (in height and orientation) when the vehicle 201 reaches its destination within the tool bay. Moreover, all I/O ports can efficiently be served by a single vehicle 201 irrespective of their different heights above floor in the tool bay. Thus the operation of the vehicle/compartment structure can be made very time efficient by a close and immediate cooperation between the vehicle and the scheduler (not shown) in the factory and/or in the tool bay.

If the two rows 301 and 302 of tools 101 are sufficiently spaced apart from each other there may be provided a second track 303b and another OHT vehicle so as to enable the displacement of two vehicles 201 independently from each other between the two rows of semiconductor process tools without obstructing each other. When both vehicles can independently move to and fro within the bay 300, the tools 101 on either side of the bay can be served with a higher rate compared to a tool bay with only one track 303. It should be noted that there is no track in the arrangement of FIG. 3 that corresponds to the traversing track 103c in FIG. 1 of the prior art tool bay 100. So the intrabay transport system according to the invention is even more efficient, reducing the complexity of the entire system in comparison to the prior art. In addition the order of tools in the bay is less critical. For example, in the prior art there is typically one stocker provided on one side of the tool bay for buffering wafer carriers before they are delivered to another tool in the tool bay by the intrabay transport system or transferred to the interbay transport system. The invention increases functionality in that such stockers may be provided on either side of the tool bay and each of them are accessible by both OHT vehicles, be it directly by a first one of the vehicles or indirectly via the second one of the two vehicles.

Figure 4:
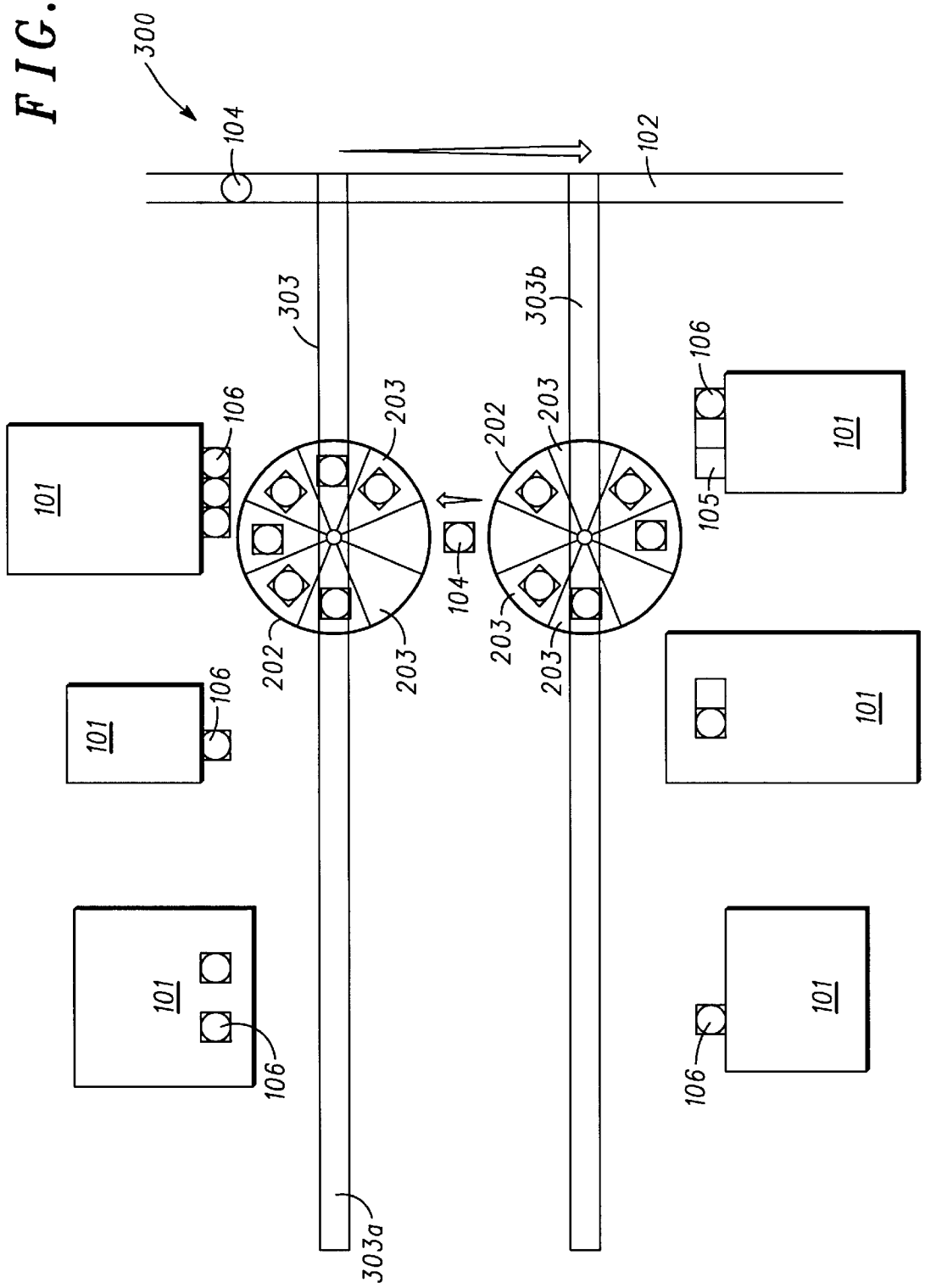
FIG. 4 is another top view of the tool bay of FIG. 3.

The arrangement of FIG. 3 may be improved in that the distance between the rows 301a and 301b are optimized and there are also provided means for handing—over wafer carriers from the one vehicle to the other vehicle and vice versa. This is illustrated in FIG. 4 that shows the same arrangement of process tools 101 as FIG. 3. However, in FIG. 4 both vehicles have approached each other and one wafer carrier 104 is transferred from the vehicle on track 303b to the vehicle 303a as indicated by an arrow. For this purpose both vehicles are driven to a position on their respective tracks 303a and 303b where the distance between them is appropriate for handing—over a wafer carrier. In particular at this position both vehicles are opposite each other and the distance between them is at a minimum. As preparatory steps for the exchange of the wafer between the two compartment structures 202, the two compartment structures 202 of both vehicles are leveled by their respective hoist means 204 and afterwards the concerned compartments 203 of both structures 202 are aligned by turning until the compartments 203 are flush. These preparatory steps for the exchange of a wafer carrier between two compartment structures 202 resemble the basic steps for the attachment/undocking of wafer carriers to/from an I/O port of any of the tools 101. Only the actual handling of the wafer carrier is different in both cases which will be explained below with reference to FIG. 6A.

It is understood that there may be provided more than two vehicles on two tracks in a tool bay. With two vehicles it is ensured that they may cover the whole length of the corresponding track 303a and 303b, respectively. On the other hand with three, four or more vehicles (preferably an even number of vehicles with as many vehicles on one track as on the other track) one gains a higher flexibility in serving the tools 101 and the transport time is thus all in all reduced.

It should be noted that the multiple vehicles in a multi-track tool bay need not be arranged side by side but may also be arranged one above the other. With this constellation one of the vehicles may be reserved for service of the upper tools and the other may be reserved for service of the lower tools. It is clear that of two vehicles above each other only one is an OHT vehicle and the other is a vehicle running on the floor of the tool bay.

Irrespective of the number of vehicles 201 actually employed in the bay valuable space is saved by the transport system according to the invention. For example, with one track 303a only in the bay the tools on both sides can be served by a single compartment structure 202, no extra space needs be reserved for handing-over wafer carriers from one side to the other such as for a connecting rail 103c in FIG. 1. With two tracks 303a and 303b in the bay 300 wafer carriers can be loaded at a tool on one side of the tool bay by a first compartment structure 202. Then the wafer carrier is transferred from the first compartment structure 202 to a second compartment structure 202 of a second vehicle 201 from which it is eventually delivered to a tool on the second side of the tool bay 300. Thus clean room space is gained that may be used for further tools and that helps increasing tool density in the semiconductor factory or reducing the size of the semiconductor factory on the whole.

Figure 5:
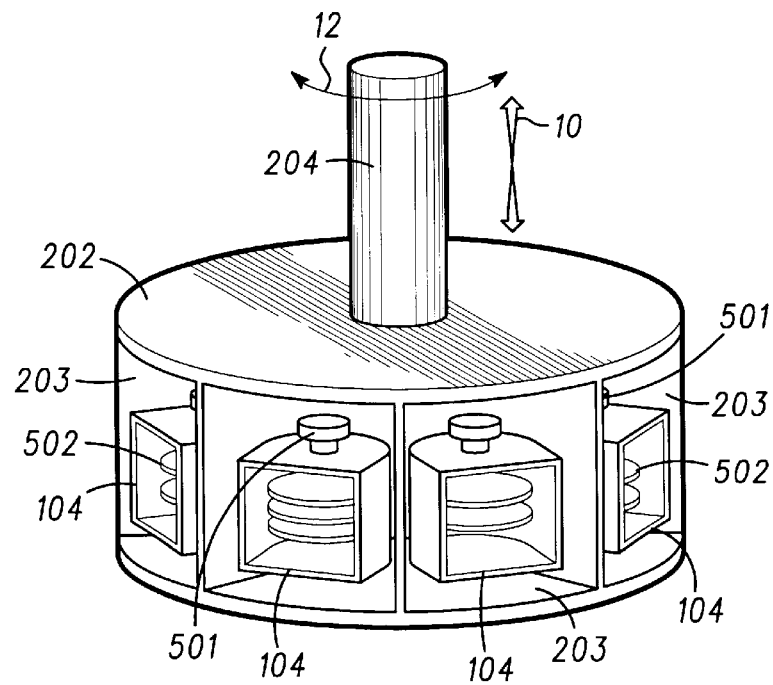
FIG. 5 is a schematic diagram of the compartment structure according to the present invention.

The compartment structure 202 is detailed in FIG. 5. The structure 202 is shown in a perspective view in FIG. 5. The structure 202 is held by the hoist means 204. The degrees of freedom (translatory and angular) are indicated by a straight and a curved double arrow, respectively. As mentioned above both movements are necessary for the compartment structure 202 in order to accommodate the different designs of the various tools 101 in the tool bay 300.

The structure 202 comprises several compartments 203. In the embodiment of FIG. 5 four of the total eight compartments 203 are visible. In general, the number of compartments 203 will be a function of the expected throughput of wafer carriers of the vehicle and of the available clear distance between the two rows of tools 101 in the tool bay 300. The clear distance between the two rows of tools 101 in the tool bay 300 determines the maximum radius of the structure 202. Thus, depending on its radius the compartment structure 202 may include either a smaller number of compartments than eight or a number greater than eight. The person skilled in the art will readily find an optimum capacity of the structure 202 that meets best the requirements of the actual tool bay to which the present invention is to be applied. Additionally, the optimum capacity of the compartment structure 202 may be made dependent on the number of tools that have wafer carrier stocking abilities. In this case the delivery system interacts with tools with and without built-in stockers for buffering multiple wafer carriers and reducing the need of their frequent service by the delivery system.

Each of the compartments 203 is designed for lodging one wafer carrier 104, as is shown in FIG. 5. The wafer carriers 104 in the compartments 203 may contain different numbers of wafers, referenced by 502. In order to hold and to carry the wafer carriers 104 each carrier comprises a handle 501 on its covering plate. Typically the wafer carrier handle 501 is a flange having a "mushroom" —shape, that is the handle 501 consists of a narrow neck with a broader plate on top of the neck. The carriers 104 are gripped by their handles 501, transferred from/to a wafer carrier port of one of the tools 101 or a compartment of another compartment structure 202 and deposited there by a robot arm (not shown).

Figure 6A:
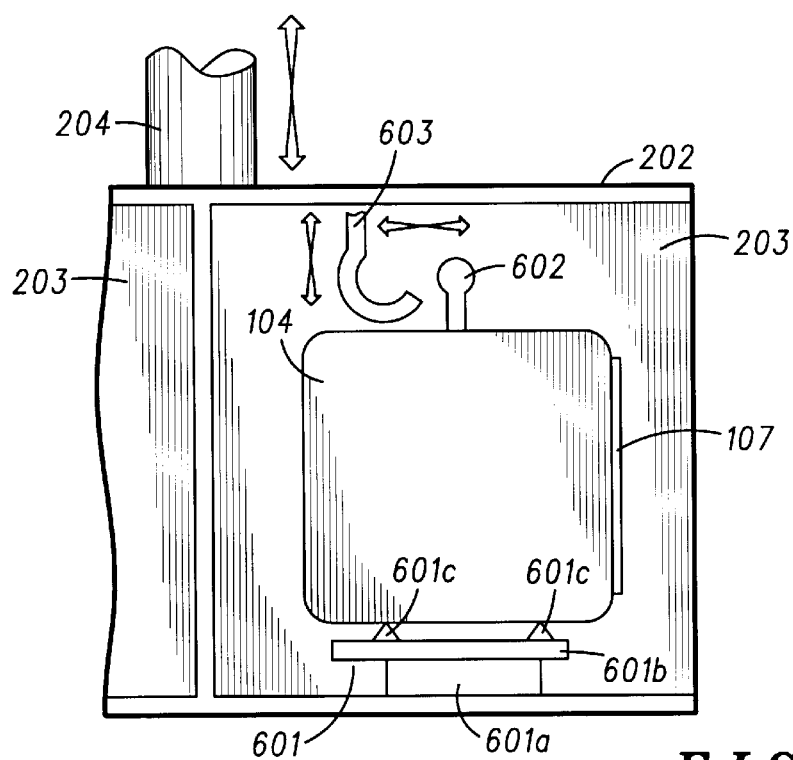
FIG. 6A, FIG. 6B and FIG. 6C show a first, a second, and a third embodiment of a compartment as part of the compartment structure according to the present invention, respectively.
Figure 6B:
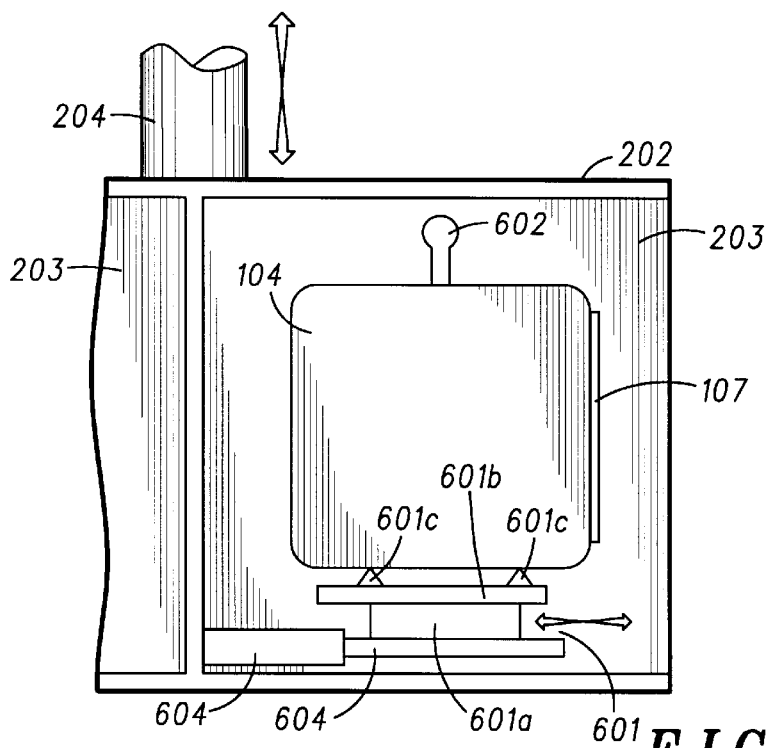
Figure 6C:
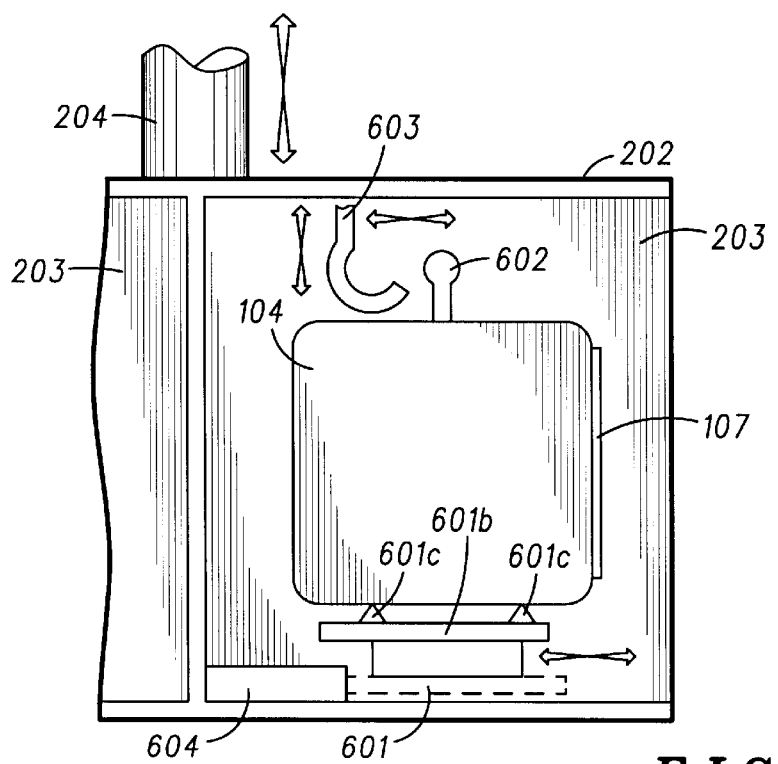

However, there are other mechanisms devisable for the transport of the wafer carriers 104. Three alternatives are shown in FIGS. 6A, 6B, and 6C. In FIG. 6A a compartment 203 is shown (right side in the FIG.) with a wafer carrier 104 in it and with another compartment adjacent to it (on the left side). The compartment structure 202 is held, lifted and turned by the hoist means 204. The wafer carrier 104 is provided with a handle 602. For the sake of clarity in FIGS. 6A, 6B, and 6C the handle 602 is of a T-shape (instead of a "mushroom"-shape), and since FIG. 6A is a side elevation the traverse bar of the "T" is seen in this view as a circle on the top of the vertical bar of the "T". To the left of the handle 602 there is a crane hook 603 with a "C"-shaped cross section that is moveable in a vertical plane so as to grip the handle 602 and to transfer the wafer carrier 104 out of the compartment 203 via the dashed boundary line on the right of the compartment 203 or to get a carrier from outside into the compartment 203. The carrier 104 is deposited inside the compartment 203 on a shelf 601 for supporting the wafer carriers 104 at their bottom surface, comprising a support plate 601b which in turn is fixed to the floor of the compartment 203 via an base plate 601a. In order to stabilize the position of the carrier 104 it is not directly deposited on the support plate 601b but on spacers 601c. The spacers 601c preferably have a triangular cross section. Thus with "T"-handle 602 and crane hook 603 there must be a crane jib (not shown) in each of the compartments 203.

The gripper 603 for holding and transporting the wafer carrier by the handle 602 on top of the carrier 104 of FIG. 6A is a passive gripper. Yet instead an active gripper could be provided with jaws that open to embrace the vertical bar of the "T"-handle 602 and close to grip the "T"-handle 602. This is particularly advantageous for handing over wafer carriers between adjacent compartment structures 202. With reference back to FIG. 4 the procedure for the exchange of a wafer by means of active grippers will be explained. It is assumed that in FIG. 4 the wafer is to transferred from the compartment structure 202 on track 303b to the compartment structure 202 on track 303a. The gripper (not shown) of the compartment structure 202 on track 303b attaches to the handle and the wafer carrier is moved out of the compartment 203, hovering above the floor between the two compartment structures 202. Next, the corresponding gripper of the other compartment structure 202 on track 303a attaches to the handle in the same way as the first gripper did—slightly above or below the first gripper. In this moment the wafer carrier is held by two grippers. Thereafter the first gripper releases the handle of the carrier and the second gripper can pull the wafer carrier into the compartment 203 of the compartments structure 202 on track 303a.

An alternative, simpler structure without a crane hook is shown in FIG. 6B. The wafer may still have a "T"-handle 602 in order to be compatible to other transport mechanisms. But the handle 602 is not needed with this alternative accommodation of the carrier 104 in the compartment 203. In the compartment 203 of FIG. 6B the carrier 104 is deposited on a telescope mount 604 that comprises one of two telescope arms. On the outer telescope arm the shelf 601 is mounted with a base plate 601 a, a support plate 601b, and spacers 601c. When the carrier is to be attached to a carrier port of one of the tools 101 the telescope mount launches the carrier 104 through the dashed boundary line on the right of the compartment 203 so that the carrier projects over the compartment boundary. It can then easily be attached to the carrier port or taken over from another compartment structure 202 (as described above).

Still another alternative of the compartment 203 with a wafer carrier 104 is shown in FIG. 6C. Here the wafer carrier is deposited on a shelf 601 comprising of the support plate 601b and the spacers 601c. The shelf 601 itself is fixed to a telescope mount 604. The telescope mount 604 covers the floor of the compartment 203 and when the telescope mount 604 is pulled-in the compartment floor is partially open (dashed rectangle). The carrier 104 is held via its handle 602 by the crane hook 603. Since the carrier is hoisted by the crane hook and there is no substantial horizontal movement this embodiment is designed for autonomously delivering and receiving wafer carriers 104 at an I/O port on top of the covering plate of any of the tools 101.

Depending on the used compartment of FIGS. 6A, 6B, and 6C the compartment structure 202 is thus capable of feeding the process tools 101 in the tool bay from the side and/or from above.

It is understood that the invention is not limited to an overhead hoist vehicle, suspended under a rail and hoisting a compartment structure. Instead, the vehicle can also be a vehicle on the floor of the tool bay, and the compartment structure is carried on a telescope arm that is pushed up and pulled down, respectively, in order to level the compartment with any of the carrier ports of the tools 101. The floor vehicle may be freely maneuverable or may be guided by a guiding mechanism such as the tracks 103 and 303 in FIGS. 1 and 3. In any case a vehicle on the floor of the tool bay has the advantage that it may be run not only along one but along two horizontal directions so that it covers the complete tool bay.

Further, it is also understood that the compartment structure is not necessarily horizontal but may also be vertically arranged. In this case the structure of FIG. 5 must be turned 90° and the rotation axis is horizontal instead of vertical as shown in FIGS. 2, 3 and 4.

Still another modification relates to the number of compartment levels. Whereas in the above description of the invention there was only one plane of compartments 203 a person skilled in the art might readily expand this structure to a two level or even three level compartment structure with two or three compartments above each other. The compartments 203 of different levels may be aligned to each other or may be alternately arranged.

As a summary, the unique aspects, advantages and features of the system according to the invention are: the compartment structure is circular, it is robot designed to accommodate stocker design, rapid placement of wafer carriers to robot is facilitated, there may be provided a free area or staging area at top of the compartment structure for batch pick of material, the number of OHT vehicles required per bay is reduced; the bay throughput is increased and may reach the target of up to 150 moves per hour, and that a high throughput of 300 mm wafers is achievable by the transport system according to the invention. Further, the flexibility of the transport system is enhanced in comparison to prior art systems, since the present inventions offers a random access to the carriers by simply turning the compartment structure into the desired position irrespective of the time schedule for other loaded carriers.

While the invention has been described in terms of particular structures, devices and methods, those of skill in the art will understand based on the description herein that it is not limited merely to such examples and that the full scope of the invention is properly determined by the claims that follow.

What is claimed is:

1. An intrabay transport system for receiving, transporting and delivering a wafer carrier within a tool bay, the tool bay including a plurality of semiconductor process tools each having at least one wafer carrier port for the attachment of at least one wafer carrier to said tool, said intrabay transport system comprising:

at least one vehicle for receiving and delivering a wafer carrier to and from any one semiconductor process tool of said plurality of semiconductor process tools, and a vehicle guiding mechanism for guiding said at least one vehicle along at least one direction in front of said plurality of semiconductor process tools, wherein said at least one vehicle further comprises a circular compartment structure including a plurality of compartments for buffering said wafer carrier between receiving it at a first location and delivering it at a second location, each compartment being arranged for accommodating one wafer carrier, said compartment structure being rotatable around a symmetry axis of itself for an alignment.

2. The intrabay transport system as recited in claim 1, wherein said vehicle guiding mechanism guides said at least one vehicle along two horizontal directions.

3. The intrabay transport system as recited in claim 1, wherein said compartment structure comprises a gripper for holding and transporting said wafer carrier by a handle on top of said wafer carrier.

4. The intrabay transport system as recited in claim 3, wherein said gripper is a passive gripper.

5. The intrabay transport system as recited in claim 3, wherein said gripper is an active gripper including jaws that open and close for gripping said wafer carrier.

6. The intrabay transport system as recited in claim 1, wherein said circular compartment structure comprises a telescope mount having a shelf for supporting the wafer carriers at their bottom surface, said shelf being horizontally extendable.

7. The intrabay transport system as recited in claim 1, wherein the radius of said circular compartment structure is substantially 1.5 times the width of said wafer carrier and there are 8 compartments arranged on the circumference/perimeter of said compartment structure.

8. The intrabay transport system as recited in claim 1, wherein said vehicle is an overhead transport vehicle suspending from a ceiling above said tool bay.

9. The intrabay transport system as recited in claim 8, wherein said compartment structure is capable of feeding a process tool of said plurality of process tools from the side and/or from above.

10. The intrabay transport system as recited in claim 1, wherein said circular compartment structure is rotatable around a vertical symmetry axis of said vehicle.

11. The intrabay transport system as recited in claim 1, wherein said at least one vehicle comprises a guard cover for catching parts falling from said compartment structure to a floor of said tool bay below said intrabay transport system.

12. A processing tool bay within a semiconductor fabrication site, the processing tool bay including a plurality of semiconductor processing tools for processing wafers, said semiconductor processing tools being arranged in two opposite rows, each semiconductor processing tool of said plurality of semiconductor processing tools having a wafer carrier port for the attachment of at least one wafer carrier to said semiconductor processing tool and for a transfer of a wafer carrier into and out of said each semiconductor processing tool, said processing tool bay comprising:

a transport system for transporting said wafer carrier around the process tool bay at least in a vertical plane in front of one of said two rows of semiconductor process tools, said transport system including at least one vehicle for receiving and delivering a wafer carrier to and from any one semiconductor process tool of said plurality of semiconductor process tools, wherein said at least one vehicle comprises a circular compartment structure having a plurality of compartments for buffering said wafer carrier between receiving it at a first location and delivering it at a second location, said compartment structure being rotatable around a symmetry axis of itself for an alignment, and the distance between said two opposite rows is determined so as to enable a displacement of said at least one vehicle between said two rows of semiconductor process tools.

13. The processing tool bay within a semiconductor fabrication site as recited in claim 12, wherein each of two vehicles is moveable independently from the other of said two vehicles along one of two tracks, said two tracks being disposed vertically above each other between said two rows of semiconductor process tools.

14. The processing tool bay within a semiconductor fabrication site as recited in claim 12, wherein the distance between said two opposite rows of semiconductor process tools is determined so as to enable the displacement of two vehicles independently from each other horizontally side by side between said two rows of semiconductor process tools without obstructing each other.

15. The processing tool bay within a semiconductor fabrication site as recited in claim 14, wherein the distance between said two opposite rows is determined so as to enable said two vehicles to hand-over a wafer carrier from the one vehicle to the other vehicle.

16. The processing tool bay within a semiconductor fabrication site as recited in claim 12, wherein said vehicle is an overhead transport vehicle suspending from a ceiling above said tool bay.

17. The processing tool bay within a semiconductor fabrication site as recited in claim 12, wherein said vehicle is capable of approaching a semiconductor process tool of said plurality of semiconductor process tools from the side and/or from above.

18. The processing tool bay within a semiconductor fabrication site as recited in claim 12, wherein said wafer carrier ports for the attachment of at least one wafer carrier to said semiconductor process tool of said plurality of processing tools are positioned in a common vertical plane.

19. A transport system within a semiconductor fabrication site, the site including a plurality of processing tool bays, each processing tool bay including a plurality of semiconductor processing tools, an interbay transport system for transferring a wafer carrier within said semiconductor fabrication site from and to a delivery position of a processing tool bay of said plurality of processing tool bays, and an intrabay transport system for transferring a wafer carrier from and to said delivery position of said processing tool to and from a semiconductor processing tool of said plurality of semiconductor processing tools within said processing tool bay of the plurality of processing tool bays, wherein said intrabay transport system for receiving and delivering a wafer carrier within a tool bay comprises:

at least one vehicle for receiving and delivering a wafer carrier to and from any one semiconductor process tool of said plurality of semiconductor process tools, and a vehicle guiding mechanism for guiding said at least one vehicle along at least one direction in front of said plurality of semiconductor process tools, wherein said at least one vehicle further comprises a circular compartment structure including a plurality of compartments for buffering said wafer carrier between receiving it at a first location and delivering it at a second location, each compartment being arranged for accommodating one wafer carrier, said compartment structure being rotatable around a symmetry axis of itself for an alignment.

20. The transport system within a semiconductor fabrication site as recited in claim 19, wherein said intrabay transport system comprises at least two vehicles.

21. The transport system within a semiconductor fabrication site as recited in claim 19, wherein said intrabay transport system works above the plane of said wafer carrier ports.

22. The transport system within a semiconductor fabrication site as recited in claim 19, wherein said wafer carriers are rotated into position as the at least one vehicle moves inside the process bay.

* * * * *